United States Patent
Ueda

(10) Patent No.: US 7,869,260 B2
(45) Date of Patent: Jan. 11, 2011

(54) SEMICONDUCTOR STORAGE DEVICE

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 136 days.

(21) Appl. No.: 12/409,958

(22) Filed: Mar. 24, 2009

(65) Prior Publication Data
US 2009/0323395 A1 Dec. 31, 2009

(30) Foreign Application Priority Data
Jun. 30, 2008 (JP) ............................. 2008-170235

(51) Int. Cl.
*G11C 11/00* (2006.01)
(52) U.S. Cl. .............. 365/148; 365/189.09; 365/230.06
(58) Field of Classification Search ................. 365/148, 365/158, 171, 189.06, 189.09, 230.06, 210
See application file for complete search history.

(56) References Cited

U.S. PATENT DOCUMENTS

| 6,385,111 | B2 | 5/2002 | Tran et al. | |
|---|---|---|---|---|
| 6,504,778 | B1 * | 1/2003 | Uekubo ................. | 365/189.15 |
| 6,600,690 | B1 | 7/2003 | Nahas et al. | |
| 6,859,383 | B2 * | 2/2005 | Baker ......................... | 365/148 |
| 7,262,628 | B2 * | 8/2007 | Southwell et al. ........... | 324/769 |
| 7,345,512 | B2 * | 3/2008 | Tran et al. ..................... | 327/52 |

FOREIGN PATENT DOCUMENTS

JP 2006-4480 1/2006

* cited by examiner

*Primary Examiner*—Gene N Auduong
(74) *Attorney, Agent, or Firm*—Oblon, Spivak, McClelland, Maier & Neustadt, L.L.P.

(57) ABSTRACT

A plurality of memory cells, each including a variable resistance element capable of having four or more values, are arranged at intersections of first wirings and second wirings. A control circuit selectively drives the first and second wirings. A sense amplifier circuit compares, with a reference voltage, a voltage generated by a current flowing through a selected memory cell. A reference voltage generation circuit includes: a resistance circuit including first and second resistive elements connected in parallel. Each of the first resistive elements has a resistance value substantially the same as a maximum resistance value in the variable resistance elements, and each of the second resistive elements has a resistance value substantially the same as a minimum resistance value in the variable resistance elements. A current regulator circuit averages currents flowing through the first and second resistive elements.

18 Claims, 14 Drawing Sheets

VRow Driver 13

Column Switch 20

Column decoder 21

Sense Amp & Write Buffer 22

VCol Driver 23

$Iref1 = (5I_{00}+I_{11})/6 = (I_{00}+I_{11})/2 + 2*(I_{00}-I_{11})/6$

SEMICONDUCTOR STORAGE DEVICE

CROSS REFERENCE TO RELATED APPLICATIONS

This application is based on and claims the benefit of priority from prior Japanese Patent Application No. 2008-170235, filed on Jun. 30, 2008, the entire contents of which are incorporated herein by reference.

BACKGROUND OF THE INVENTION

1. Field of the Invention

The present invention relates to a semiconductor storage device.

2. Description of the Related Art

Resistive memory has attracted increased attention as a likely candidate for replacing flash memory. As described herein, it is assumed that the resistive memory devices include ReRAM (Resistive RAM), in a narrow sense, that stores its resistance states in a non-volatile manner using transition metal oxide as a recording layer, as well as Phase Change RAM (PCRAM) that uses chalcogenide, etc., as a recording layer with resistance information on its crystalline states (conductors) and amorphous states (insulators).

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity storage may be achieved without an increase in cell array area by arranging such memory cell arrays laminated in a three-dimensional manner.

In such resistive memory, multi-value storage type memory has been proposed in an attempt to increase storage capacity where data of not less than 2 bits is stored in one memory cell by controlling resistance values of the variable resistance elements in one memory cell in a number of stages (see, for example, Japanese Patent Laid-Open No. 2006-4480).

However, such resistive memory of multi-value storage type has a problem that it is difficult for a sense amplifier circuit to control and provide a reference voltage with high accuracy. Any errors in the reference voltage can increase the likelihood that an erroneous read operation will occur in a memory cell in which multi-values have been stored.

SUMMARY OF THE INVENTION

One aspect of the present invention provides a semiconductor storage device comprising: a memory cell array having a plurality of memory cells arranged at intersections of a plurality of first wirings and a plurality of second wirings, each of the memory cells including a variable resistance element capable of taking on four or more types of resistance values; a control circuit selectively driving the first wirings and the second wirings; a sense amplifier circuit comparing, with a reference voltage, a voltage generated by a current flowing through a selected memory cell arranged at an intersection of the first wiring and the second wiring selectively driven by the control circuit; and a reference voltage generation circuit generating the reference voltage, the reference voltage generation circuit comprising: a resistance circuit including first resistive elements and second resistive elements connected in parallel, each of the first resistive elements having a resistance value substantially the same as a maximum resistance value in the variable resistance elements, and each of the second resistive elements having a resistance value substantially the same as a minimum resistance value in the variable resistance elements; and a current regulator circuit averaging currents flowing through the first resistive elements and the second resistive elements.

DETAILED DESCRIPTION OF THE EMBODIMENTS

Embodiments of the present invention will now be described below with reference to the accompanying drawings. In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

Figure 1:
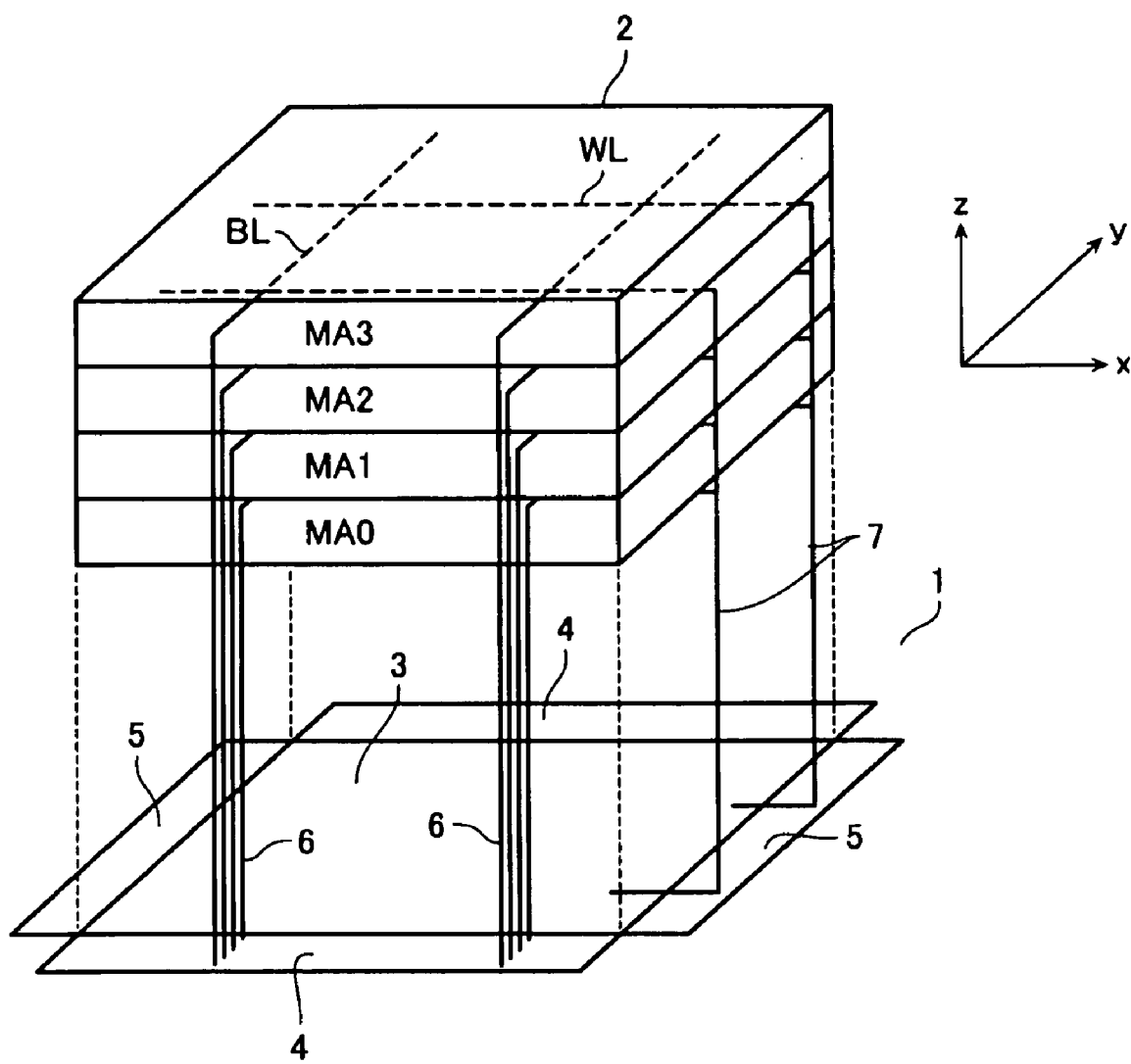
FIG. 1 is a perspective view illustrating a configuration of a resistive memory device according to an embodiment of the present invention.

FIG. 1 illustrates a basic configuration of a resistive memory device according to an embodiment of the present invention, i.e., configuration of a wiring region 3, in which wirings such as global buses are formed on a semiconductor substrate 1, and a memory block 2 laminated thereon.

In the case of FIG. 1, the memory block 2 includes four layers of memory cell arrays MA0 to MA3. The wiring region 3 is provided on the semiconductor substrate 1 immediately below the memory block 2. The wiring region 3 has, for example, global buses provided thereon for communicating data written to and read from the memory block 2 with the external. As described below, a column control circuit including a column switch, etc., and a row control circuit including a row decoder, etc., may also be provided on the wiring region 3.

It is necessary to provide vertical wirings (via contacts) on the side surface of the memory block 2 for connecting word lines WL and bit lines BL of the laminated memory cell arrays MA to the wiring region 3 formed on the semiconductor substrate 1. The wiring region 3 has bit-line contact regions 4 and word-line contact regions 5 provided on its four sides. The bit-line contact regions 4 and the word-line contact regions 5 have bit-line contacts 6 and word-line contacts 7 formed therein for connecting the bit lines BL and the word lines WL to the control circuits. Each of the word lines WL is connected to the wiring region 3 via a respective word-line contact 7, one end of which is formed on one of the word-line contact regions 5. In addition, each of the bit lines BL is connected to the wiring region 3 via a respective bit-line contact 6, one end of which is formed on one of the bit-line contact regions 4.

Although FIG. 1 illustrates one memory block 2 with multiple memory cell arrays MA laminated in a direction perpendicular to the semiconductor substrate 1 (the z direction of FIG. 1), a plurality of such memory blocks 2 are, in fact, arranged in a matrix form in a longitudinal direction to the word lines WL (the x direction of FIG. 1) as well as in another longitudinal direction to the bit lines BL (the y direction of FIG. 1).

As illustrated in FIG. 1, in the word-line contact region 5 according to this embodiment, the contacts are provided along a single row. Specifically, those word lines WL in all layers of one cross section are connected to the wiring region 3 via the common contacts. In addition, in the bit-line contact region 4, the bit lines BL in each layer are connected to the wiring region 3 via four lines of contacts separately prepared for each layer. Although the bit lines BL are independently driven for each layer and the word lines WL are connected in common in all layers in this embodiment, the word lines WL may also be independently driven for each layer. Alternatively, the bit lines BL may also be connected in common and the word lines WL may be independently driven. Moreover, at least one of the bit lines BL and the word lines WL may be configured to be shared between the upper and lower layers.

Figure 2A:
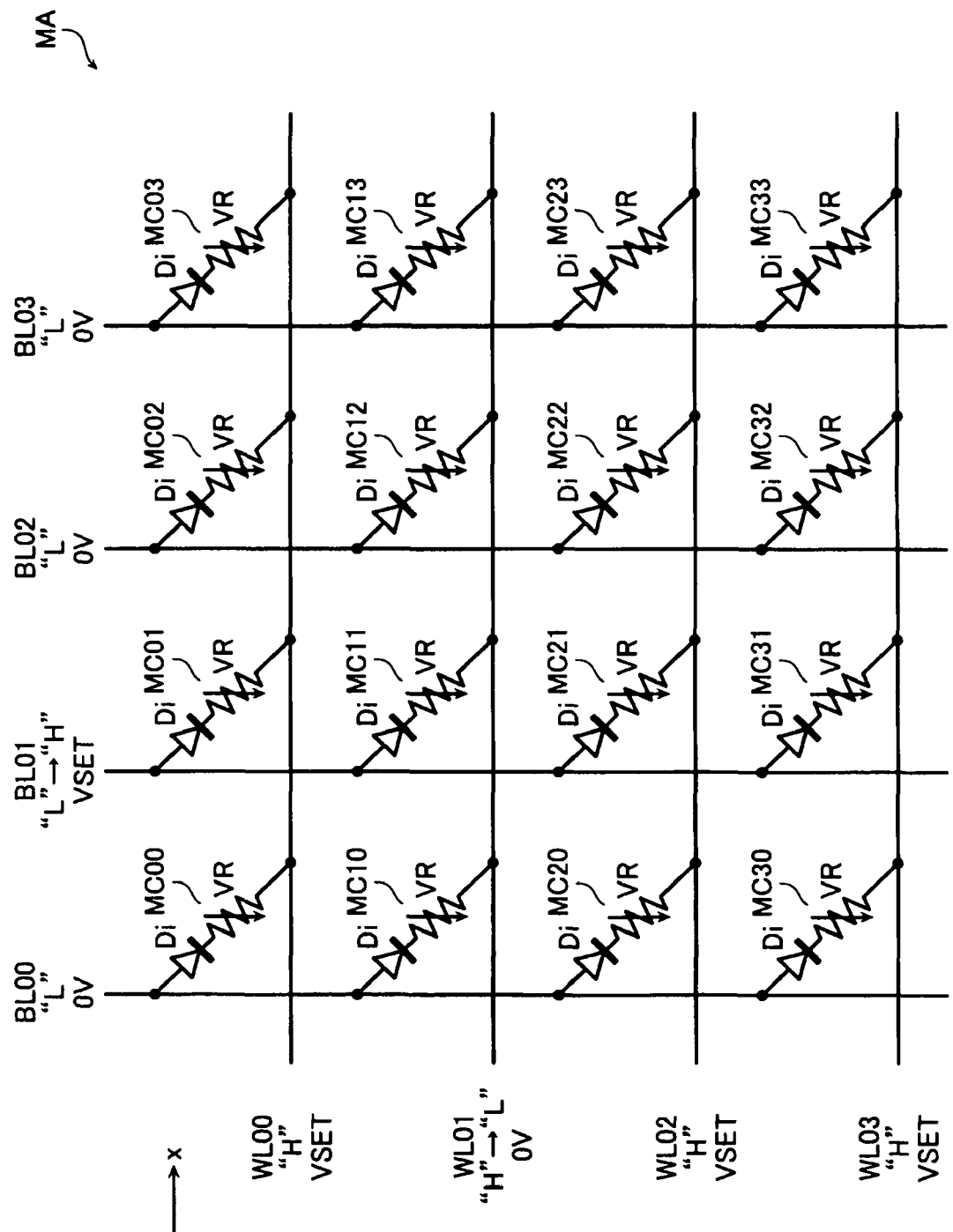
FIG. 2A is an equivalent circuit diagram of a memory cell array in the resistive memory device according to the embodiment of the present invention.

FIG. 2A is an equivalent circuit diagram of a memory cell array MA in the resistive memory device. In this case, the memory cell array MA illustrated in FIG. 2 has a plurality of unit memory cells MC arranged in a longitudinal direction of the bit lines BL (the y direction of FIG. 2A) as well as in another longitudinal direction of the word lines WL (the x direction of FIG. 2A), respectively, in a two dimensional matrix form. As can be seen, resistance-varying type unit memory cells MC are arranged at intersections between word lines WL and bit lines BL, with rectifier elements, e.g., diodes Di, and variable resistance elements VR connected in series. It should be noted that the arrangement and polarity of the diodes Di and the variable resistance elements VR included in the memory cells MC are not limited to the illustrated ones.

Figure 2B:
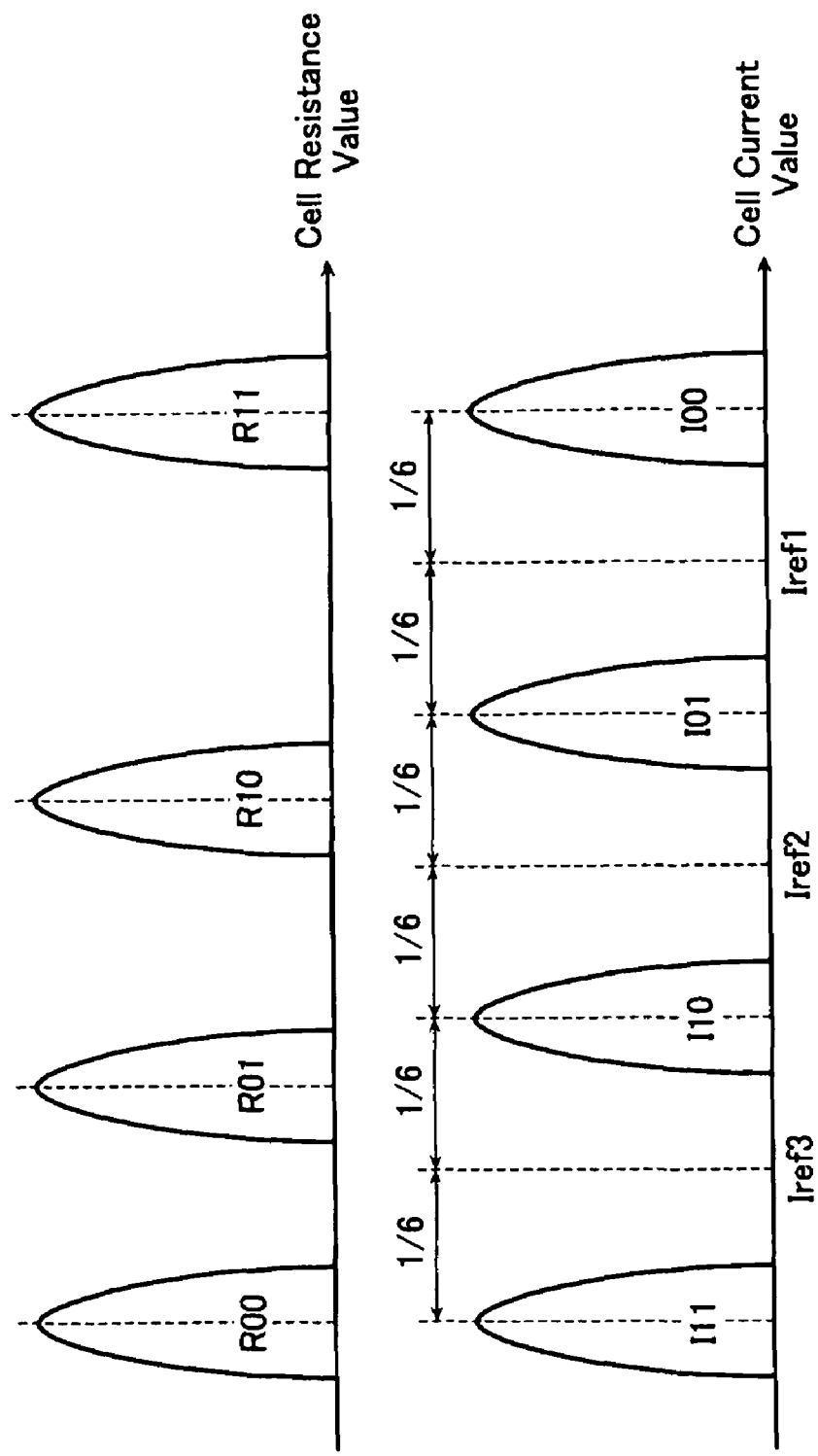
FIG. 2B illustrate example resistance and current distributions of a memory cell MC.

Note that, in this embodiment, different circuits are configured to allow data of not less than 2 bits to be stored in each memory cell. Here, consider an example scenario where 2-bit data may be stored in one memory cell MC. That is, for example, one memory cell MC may have four different resistance distributions having resistance values R00, R01, R10, and R11 as central values, as illustrated in FIG. 2B. Accordingly, the distribution of current flowing through the memory cell MC also varies as illustrated in FIG. 2B (central values: I11, I10, I01, and I00) for different resistance distribution. The resistance values of the memory cell MC are controlled in writing data so that equally-spaced current distributions can be obtained. Further, a reference voltage generation circuit is configured to generate reference currents Iref1, Iref2, and Iref3 near the central point of the respective current distribution so that accurate detection of current distribution can be achieved. Assuming, for example, that ideal distributions are obtained where I00, I01, I10, and I11 are spaced apart from each other by approximately (I11−I00)/6×2, it is desirable that the reference currents Iref1, Iref2, and Iref3 are set near the central points of the respective current distributions (see FIG. 2B). In this embodiment, based on the recognition that the minimum resistance value R00 and the maximum resistance value R11 can be obtained with a higher degree of precision than the other resistance values (R01 and R10), the reference currents Iref1, Iref2, and Iref3 are generated with reference to the resistance values R00 and R11. The details of this process are discussed more fully below.

The variable resistance elements VR, which have, for example, a structure of electrode/transition metal oxide/electrode, provide a change in resistance value of metal oxide depending on the conditions of applied voltage, current, heat, etc., and store the states of different resistance values as information in a non-volatile manner. More specifically, the following can be used as the variable resistance element VR: an element changing its resistance values with a phase transition between a crystalline state and an amorphous state, such as chalcogenide (PCRAM); an element changing its resistance values by depositing metal cations to form a contacting bridge between electrodes, or ionizing the deposited metal to break down the contacting bridge (CBRAM: Conductive Bridging RAM), an element changing its resistance values through application of voltage or current (ReRAM) (which is divided broadly into two types: one is the type where a resistance change occurs depending on the presence or absence of charges trapped by a charge trap residing on the electrode interface; and the other is the type where a resistance change occurs depending on the absence or presence of a conductive path due to oxygen defect, etc.) and so on.

In unipolar-type ReRAM, data is written to a memory cell MC by applying, for example, a voltage of 3.5V (actually 4.5V including a voltage drop in the corresponding diode Di) and a current of 10 nA to a variable resistance element VR, for a period of 10 ns to 100 ns. As a result, the variable resistance element VR changes from a high resistance state to a low resistance state. The operation of changing a variable resistance element VR from a high resistance state to a low resistance state is hereinafter referred to as the "setting operation".

On the other hand, data is erased from a memory cell MC by applying, for example, for a period of of 500 ns to 2 μs, a voltage of 0.8V (actually 1.8V including the voltage drop in the corresponding diode Di) and a current of 1 μA to 10 μA to a variable resistance element VR in its low resistance state after the setting operation. As a result, the variable resistance element VR changes from a low resistance state to a high resistance state. The operation of changing a variable resistance element VR from a low resistance state to a high resistance state is hereinafter referred to as the "reset operation". In such a memory cell, a high resistance state is defined as a stable state (a reset state), and in a binary storage memory cell, a write operation is conducted by the setting operation that causes a reset state to be switched to a low resistance state.

A read operation from a memory cell MC is performed by applying a voltage of 0.4V (actually 1.4V including a voltage drop in the corresponding diode Di) to a variable resistance element VR and monitoring a current flowing through the variable resistance element VR at a sense amplifier. As a result, it is determined whether the variable resistance element VR is in its low resistance or high resistance state. Note that if one memory cell MC can retain 2-bit data, then three different reference voltages are generated and compared with cell signals by the sense amplifier.

Referring again to FIG. 2A, the setting operation of the resistive memory device according to this embodiment will be described below. FIG. 2A illustrates the states of voltage applied to the bit lines BL and the word lines WL connected to a memory cell array MA in a setting operation of a memory cell MC. In this case, given that the selected memory cell MC to which data is to be written by the setting operation is MC11.

Non-selected bit lines BL00, BL02, and BL03 that are not connected to the selected memory cell MC11 are in "L" state (in this embodiment, Vss=0V). During the setting operation, the selected bit line BL01 that is connected to the selected memory cell MC11 is driven from "L" state (Vss=0V) to "H" state (in this embodiment, voltage VSET). In addition, non-selected word lines WL00, WL02, and WL03 that are not connected to the selected memory cell MC11 are in "H" state (in this embodiment, voltage VSET). During the setting operation, the selected word line WL01 that is connected to the selected memory cell MC11 is driven from the "H" state (voltage VSET) to "L" state (in this embodiment, voltage Vss=0V). As a result, the diode Di in the selected memory cell MC11 is turned to a forward-biased state, which causes current flow therethrough. Then a potential difference VSET is applied to the selected memory cell MC11 and the corresponding variable resistance element VR changes from a high resistance state to a low resistance state, after which the setting operation is completed. If one memory cell MC stores 2 bits, the resistance values of the memory cell MC are controlled in four ways by the operation of, e.g., a verification circuit, not illustrated.

Figure 3:
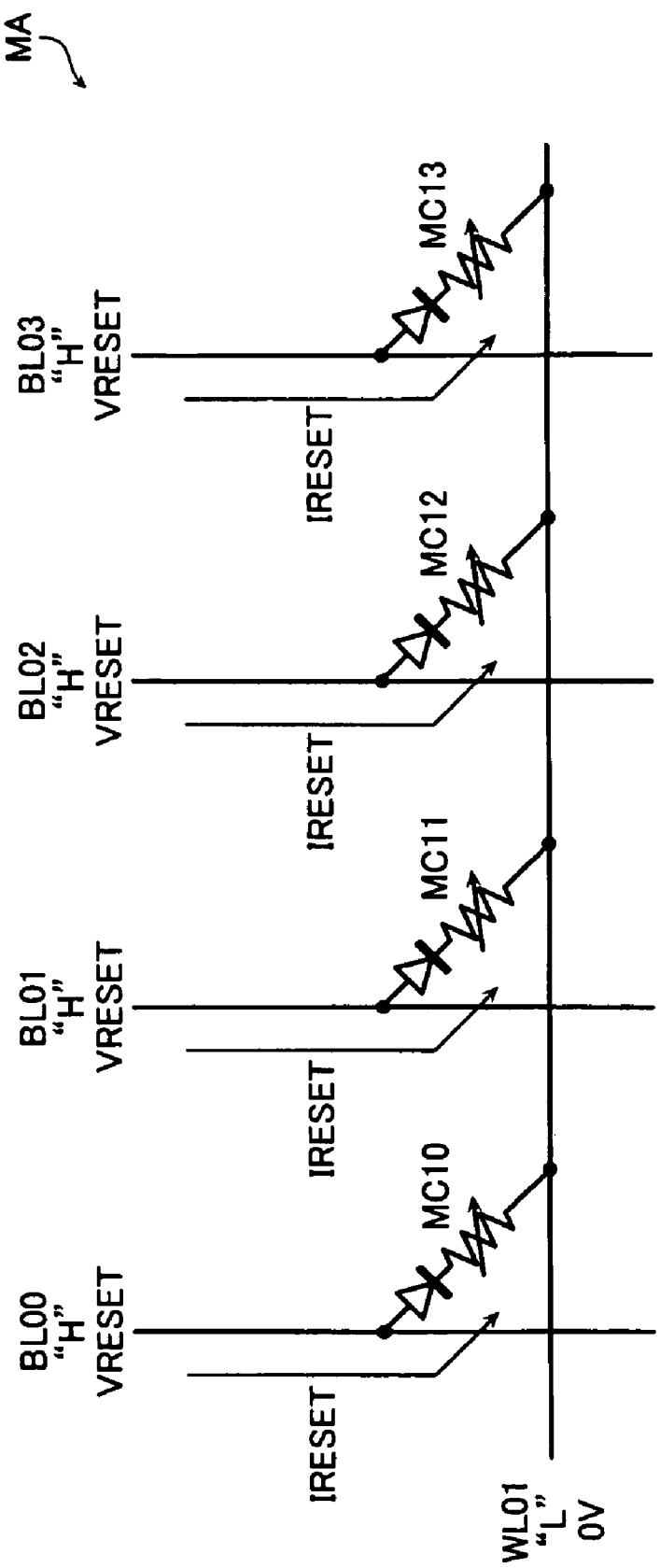
FIG. 3 is a conceptual diagram illustrating the reset operation of the resistive memory device.

Referring now to FIG. 3, a reset operation of the resistive memory device will be described below.

During the reset operation, the selected bit lines BL00 to BL03 that are connected to the selected memory cells MC10 to MC13 are driven to "H" state (in this embodiment, voltage VRESET). In addition, during the reset operation, the selected word line WL01 that is connected to the selected memory cells MC10 to MC13 is driven to "L" state (in this embodiment, voltage Vss=0V). In this case, non-selected word lines WL00, WL02, and WL03 that are not connected to the selected memory cells MC10 to MC13 are in "H" state (e.g., voltage VRESET). Further, reset voltages VRESET being applied to the bit lines BL00 to BL03 are such reference voltages that allow the variable resistance elements VR in the memory cells MC to change from low resistance states to high resistance states, respectively.

Upon voltage being applied to the selected bit lines BL00 to BL03, the diodes Di in the selected memory cells MC10 to MC13 are forward biased and current flows therethrough. A reset current IRESET flows through each of the memory cells MC that allows for a reset operation. Due to the reset voltages VRESET and the reset currents IRESET applied to the bit lines BL00 to BL03, the corresponding variable resistance elements VR change from low resistance states to high resistance states, after which the reset operation is completed.

[Configuration of Control Circuits]

Figure 4:
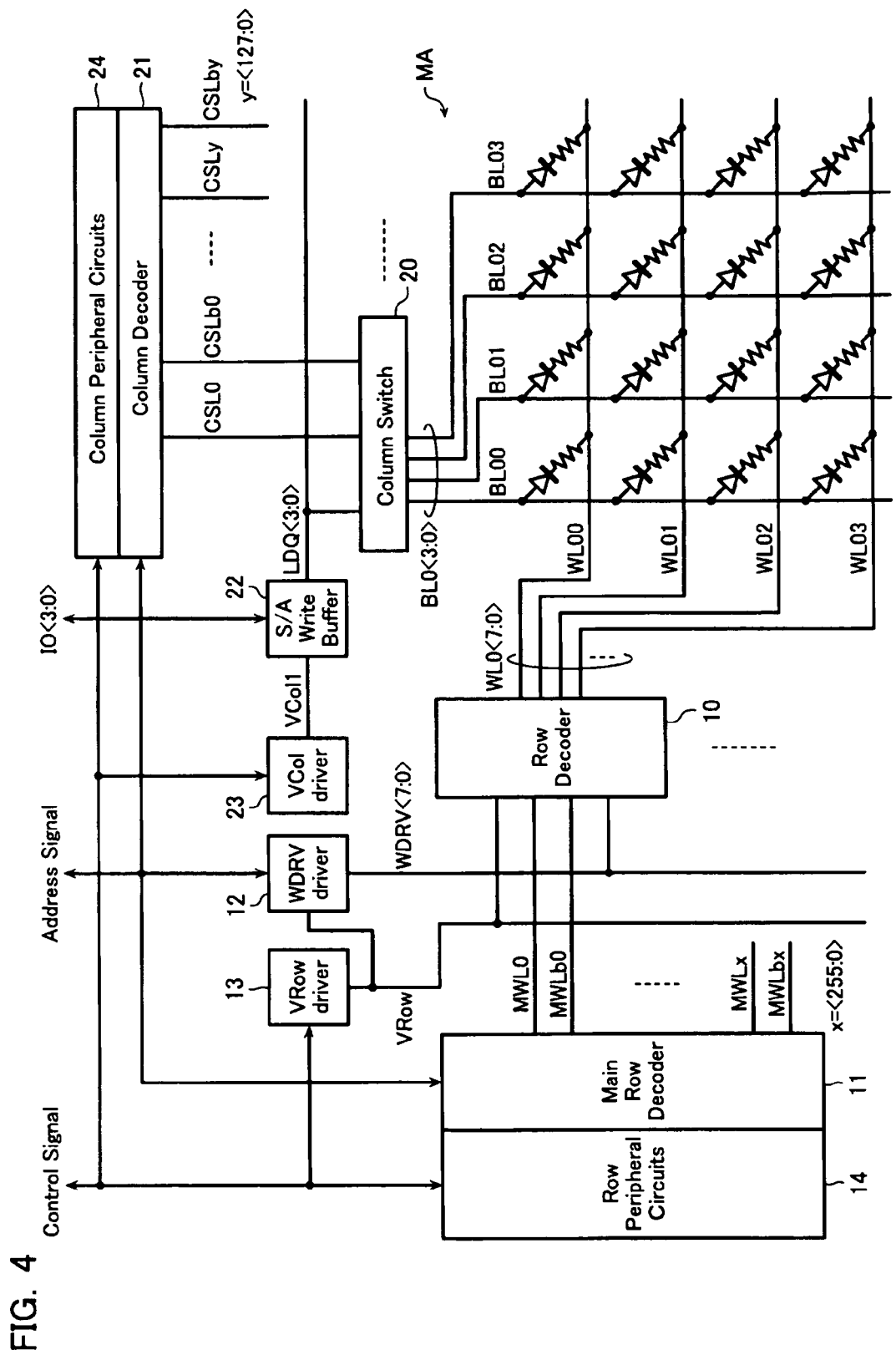
FIG. 4 is a block diagram illustrating an example arrangement of column/row control circuits in the resistive memory device according to the embodiment of the present invention.

Referring now to FIGS. 4 to 12, a circuit configuration of the resistive memory device will be described below. In this case, for example, a memory cell array MA illustrated in FIG. 4 has 2-Kbit (2048) unit memory cells MC arranged therein in the longitudinal direction to the bit lines BL, as well as 512-bit unit memory cells MC in the longitudinal direction to the word lines WL. Here, consider an example scenario where 1 Mbit (about $10^6$) unit memory cells MC are arranged in one memory cell array MA. FIG. 4 is a block diagram illustrating an example arrangement of a column control circuit and a row control circuit in the resistive memory device.

As illustrated in FIG. 4, for example, a row control circuit includes row decoders 10, a main row decoder 11, a write-drive-line driver 12, a row-power-supply-line driver 13, and row peripheral circuits 14. In addition, for example, a column control circuit includes a column switch 20, a column decoder 21, a sense amplifier/write buffer 22, a column-power-supply-line driver 23, and column peripheral circuits 24.

The word lines WL according to this embodiment has a hierarchical structure. A main row decoder 11 selectively drives any one of 256 pairs of main word lines MWLx and MWLbx (x=<255:0>). As an example, in the selected main word lines MWLx and MWLbx, the main word line MWLx turns to "H" state and the main-word line MWLbx turns to "L" state. Conversely, in the other non-selected main word lines MWLx and MWLbx, the main word lines MWLx turn to "L" state and the main-word lines MWLbx turn to "H" state. A pair of main word lines MWLX and MWLbx are connected to one row decoder 10. A row decoder 10 selectively drives one word line among the group of eight word lines WLx<7:0> under the main word lines MWLX and MWLbx in the hierarchy. A word line WL is selectively driven by the row decoder 10 that is connected to those main word lines MWLX and MWLbx selectively driven by the main row decoder 11.

Eight write drive lines WDRV<7:0> and a row power-supply line VRow are connected to the write-drive-line driver 12, while the row power-supply line VRow is connected to the row-power-supply-line driver 13. The write drive lines WDRV<7:0> and the row power-supply line VRow are connected to the row decoders 10. The write drive lines WDRV<7:0> and the row power-supply line VRow are applied with voltage for use by a row decoder 10 to drive a word line WL. Specifically, in reset operation, voltage Vss (=0V) is supplied to one of the eight write drive lines WDRV<7:0> corresponding to the selected word line WL, while voltage VRESET supplied to the other seven write drive lines. In addition, the row power-supply line VRow is applied with voltage (VRESET) that is supplied to the word lines WL under the non-selected word lines MWL and MWLbx in the hierarchy.

The row peripheral circuits 14 manage the entire resistive memory device. The row peripheral circuits 14 receive, read, write, and erase control signals from external host devices, manage the input/output data, and so on.

The bit lines BL according to this embodiment also have a hierarchical structure. The column decoder 21 selectively drives multiple pairs of column selection lines CSLy and CSLby among 128 pairs of column selection lines CSLy and CSLby (y=<127:0>). As an example, in the selected column selection lines CSLy and CSLby, the column selection line CSLy turns to "H" state and the column selection line CSLby turns to "L" state. Conversely, in the other non-selected column selection lines CSLy and CSLby, the column selection lines CSLy turn to "L" state and the column selection lines CSLby turn to "H" state.

A pair of column selection lines CSLy and CSLby is connected to one column switch 20. A column switch 20 selectively drives a group of bit lines BLy<3:0> including four bit lines BL under the column selection lines CSLy and CSLby in the hierarchy. A bit lines BL is selectively driven by the column switch 20 that is connected to those column selection lines CSLy and CSLby selectively driven by the column decoder 21.

Four local data lines LDQ<3:0> are connected to the sense amplifier/write buffer 22. The local data lines LDQ<3:0> are connected to a column switch 20. The sense amplifier/write buffer 22 detects and amplifies signals read to the local data lines LDQ<3:0>, and supplies the write data input from data input/output lines IO<3:0> to a memory cell MC via a column switch 20. The local data lines LDQ<3:0> are applied with such voltage for use by a column switch 20 to drive bit lines BL. The column-power-supply-line driver 23 is connected via a column power-supply line VCol1 to the sense amplifier/write buffer 22.

The column peripheral circuits 24 manage the entire resistive memory device. The column peripheral circuits 24 receive, read, write, and erase control signals from external host devices, manage the input/output data, and so on.

Referring now to FIGS. 5 to 8, a configuration of a row control circuit will be described in detail below. FIGS. 5 to 8 are circuit diagrams, each illustrating an example configuration of a row control circuit in the resistive memory device.

[Configuration of Row Decoder 10]

Figure 5:
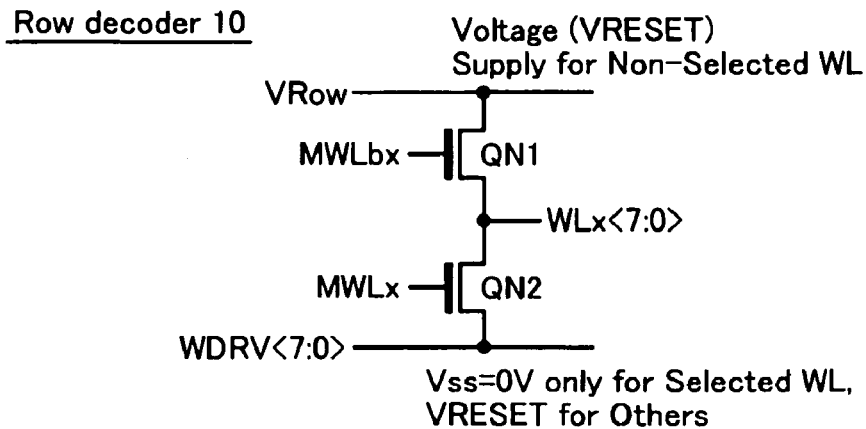
FIG. 5 is a circuit diagram illustrating an example configuration of a row control circuit in the resistive memory device according to the embodiment of the present invention.

As illustrated in FIGS. 4 and 5, a row decoder 10 is connected to any one of 256 pairs of main word lines MWLx and MWLbx (x=<255:0>), as well as to row power-supply line VRow and write drive lines WDRV<7:0>. The row decoder 10 is also connected to a group of word lines WLx<7:0>, which is in turn connected to a plurality of memory cells MC provided in a line. As can be seen from the above, a group of word lines WLx<7:0> connected to one row decoder 10 includes eight wirings of word lines WLx0 to WLx7. Similarly, the write drive lines WDRV<7:0> represent eight wirings of WDRV0 to WDRV7.

As illustrated in FIG. 5, the row decoder 10 includes eight transistor pairs, each having the sources of two NMOS transistors QN1 and QN2 connected to each other. A main-word line MWLbx is connected to the gate of the transistor QN1, and the row power-supply line VRow is connected to the drain thereof. In addition, a main word line MWLx is connected to the gate of the transistor QN2, and any one of the write drive lines WDRV<7:0> is connected to the drain thereof. Further, both transistors QN1 and QN2 have their sources connected to any one of the group of word lines WLx<7:0>.

[Configuration of Main Row Decoder 11]

Figure 6:
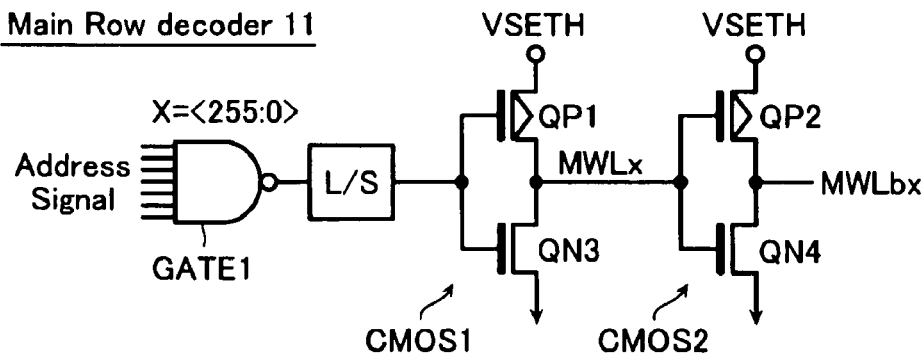
FIG. 6 is a circuit diagram illustrating an example configuration of a row control circuit in the resistive memory device according to the embodiment of the present invention.

As illustrated in FIGS. 4 and 6, 256 pairs of main word lines MWLx and MWLbx (x=<255:0>), as well as address signal lines are connected to a main row decoder 11. The word lines WL in the resistive memory device according to this embodiment have a hierarchical structure. The main row decoder 11 is a pre-decoder. Each set of main word lines MWLx and MWLbx is connected to eight transistor pairs (QN1 and QN2 in FIG. 5) in one row decoder 10, which may in turn select any one of eight word lines WLx<7:0>. Each of the main row decoders 11 has one circuit as illustrated in FIG. 6 for each pair of main word lines MWLx and MWLbx.

As illustrated in FIG. 6, in one main row decoder 11, the address signal lines connected to the main row decoder 11 are connected to a logic gate GATE1. An output signal from the logic gate GATE1 is supplied via a level shifter L/S to an input terminal of a CMOS inverter CMOS1 including a PMOS transistor QP1 and an NMOS transistor QN3. A power supply VSETH is connected to the source of the transistor QP1, while the source of the transistor QN3 is connected to the ground. Further, both transistors QP1 and QN3 have their drains connected to a main word line MWLx.

In addition, the main word line MWLx is connected to a CMOS inverter CMOS2 including a PMOS transistor QP2 and an NMOS transistor QN4. Another power supply VSETH is also connected to the source of the transistor QP2, while the source of the transistor QN4 is connected to the ground. Further, both transistors QP2 and QN4 have their brains connected to a main-word line MWLbx.

[Configuration of Write-Drive-Line Driver 12]

Figure 7:
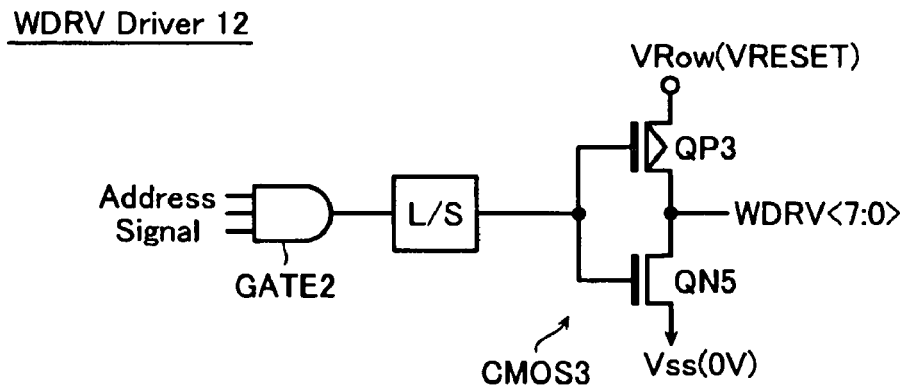
FIG. 7 is a circuit diagram illustrating an example configuration of a row control circuit in the resistive memory device according to the embodiment of the present invention.

As illustrated in FIGS. 4 and 7, a row power-supply line VRow and address signal lines are connected to the write-drive-line driver 12. In this case, the write-drive-line driver 12 is also a pre-decoder.

The address signal lines connected to the write-drive-line driver 12 are connected to a logic gate GATE2. An output signal from the logic gate GATE2 is supplied via a level shifter L/S to an input terminal of a CMOS inverter CMOS3 including a PMOS transistor QP3 and an NMOS transistor QN5. The row power-supply line VRow to which voltage VRESET is being applied is connected to the source of the transistor QP3, while the source of the transistor QN5 is connected to the ground, as described below. Further, both transistors QP3 and QN5 have their drains connected to the write drive lines WDRV<7:0>.

[Configuration of Row-Power-Supply-Line Driver 13]

Figure 8:
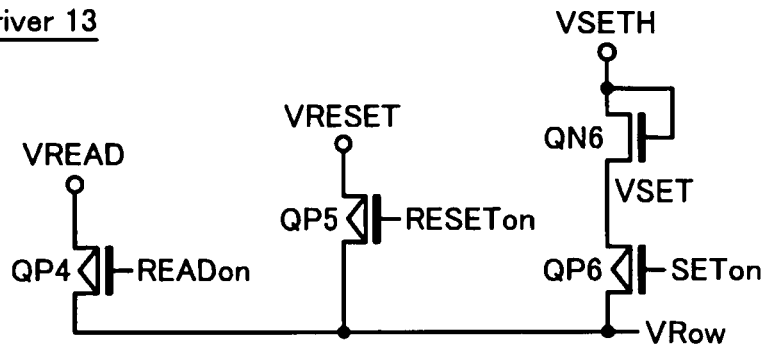
FIG. 8 is a circuit diagram illustrating an example configuration of a row control circuit in the resistive memory device according to the embodiment of the present invention.

As illustrated in FIGS. 4 and 8, a row power-supply line VRow and a control signal line are connected to the row-power-supply-line driver 13. In the row-power-supply-line driver 13, a power supply VSETH is connected to the drain and gate of an NMOS transistor QN6. The transistor QN6 has its source connected to the row power-supply line VRow via a PMOS transistor QP6. A control signal SETon is supplied to the gate of the transistor QP6.

In addition, in the row-power-supply-line driver 13, a power supply VREAD and a power supply VRESET are connected to the row power-supply line VRow via a PMOS transistor QP4 and a PMOS transistor QP5, respectively. A control signal READon is supplied to the gate of the transistor QP4, and a control signal RESETon is supplied to the gate of the transistor QP5. The control signals READon and RESETon change from "H" state to "L" state, either in data read and reset operations.

Referring now to FIGS. 9 to 12, a configuration of a column control circuit will be described in detail below. FIGS. 9 to 12 are circuit diagrams, each illustrating an example configuration of a column control circuit in the resistive memory device.

[Configuration of Column Switch 20]

Figure 9:
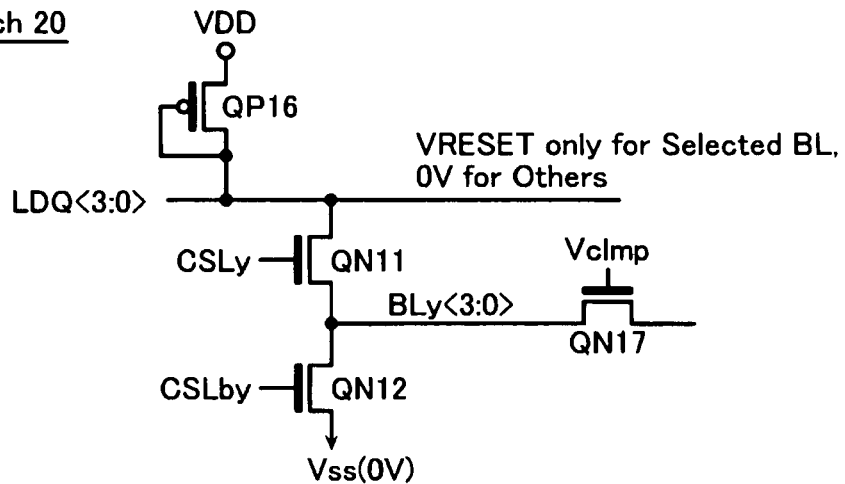
FIG. 9 is a circuit diagram illustrating an example configuration of a column control circuit in the resistive memory device according to the embodiment of the present invention.

As illustrated in FIGS. 4 and 9, a column switch 20 is connected to any one of 128 pairs of column selection lines CSLy and CSLby (y=<127:0>), as well as to local data lines LDQ<3:0>. The column switch 20 is also connected to a group of bit lines BLy<3:0>, which is in turn connected to a plurality of memory cells MC provided in a line. As can be seen from the above, each group of bit lines BLy<3:0>connected to one column switch 20 includes four wirings of bit lines BLy0 to BLy3. Similarly, the local data lines LDQ<3:0> represent four wirings of LDQ0 to LDQ3.

As illustrated in FIG. 9, the column switch 20 includes four transistor pairs, each having the sources of two NMOS transistors QN11 and QN12 connected to each other. A column selection line CSLy is connected to the gate of the transistor QN11, and any one of the local data lines LDQ<3:0> is connected to the drain thereof. In addition, a column selection line CSLby is connected to the gate of the transistor QN12, the drain of which is connected to the ground. Further, both transistors QN11 and QN12 have their sources connected to any one of the group of bit lines BLy<3:0>. Each of the bit lines BLy<3:0> is connected to a clamping transistor QN17, the gate of which is provided with clamping voltage Vclmp. With the clamping transistors QN17, the voltage of the bit lines BLy<3:0> is clamped to near a voltage (Vclmp−Vth) lower than the clamping voltage Vclmp by a threshold voltage Vth of the clamping transistors QN17.

In addition, the local data lines LDQ<3:0> are connected to the drain of a diode-connected PMOS transistor QP16 that functions as a constant current circuit (current-source load transistor) for providing a memory cell MC with a constant current. A constant current supplied from the PMOS transistor QP16 flowing through a memory cell MC produces a voltage Vcell in the local data lines LDQ<3:0>, depending on the data retained in the corresponding memory cell MC. The voltage Vcell is compared with a reference voltage at a sense amplifier circuit, thereby determining the data retained in the memory cell MC.

[Configuration of Column Decoder 21]

Figure 10:
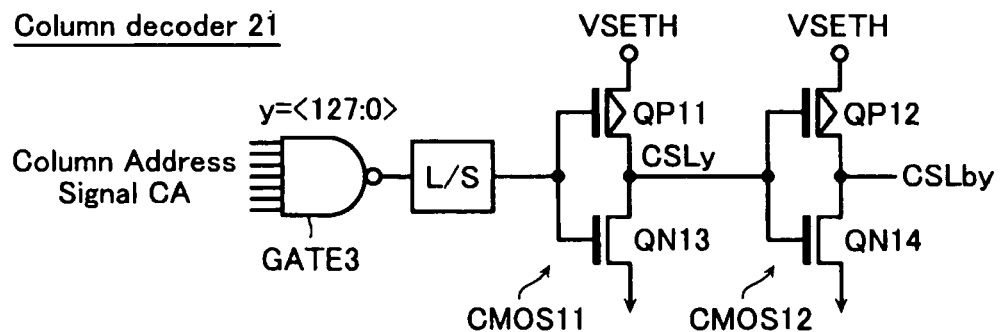
FIG. 10 is a circuit diagram illustrating an example configuration of a column control circuit in the resistive memory device according to the embodiment of the present invention.

As illustrated in FIGS. 4 and 10, a column decoder 21 is connected to 128 pairs of column selection lines CSLy and CSLby (y=<127:0>), as well as to address signal lines to which column address signals CA are input. In the resistive memory device according to this embodiment, each set of column selection lines CSLy and CSLby is connected to four transistor pairs (QN11 and QN12 in FIG. 9) in one column switch 20, which may in turn selectively drive a group of four bit lines BLy<3:0>. Each of the column decoders 21 has one circuit as illustrated in FIG. 10 for each pair of column selection lines CSLy and CSLby.

As illustrated in FIG. 10, in one column decoder 21, the address signal lines connected to the column decoder 21 is connected to a logic gate GATE3. An output signal from the logic gate GATE3 is supplied via a level shifter L/S to an input terminal of a CMOS inverter CMOS11 including a PMOS transistor QP11 and an NMOS transistor QN13. A power supply VSETH is connected to the source of the transistor QP11, while the source of the transistor QN13 is connected to the ground. Further, both transistors QP11 and QN13 have their drains connected to a column selection line CSLy.

In addition, a column selection line CSLy is connected to a CMOS inverter CMOS12 including a PMOS transistor QP12 and an NMOS transistor QN14. Another power supply VSETH is also connected to the source of the transistor QP12, while the source of the transistor QN14 is connected to the ground. Further, both transistors QP12 and QN14 have their drains connected to a column selection line CSLby.

[Configuration of Sense Amplifier/Write Buffer 22]

Figure 11:
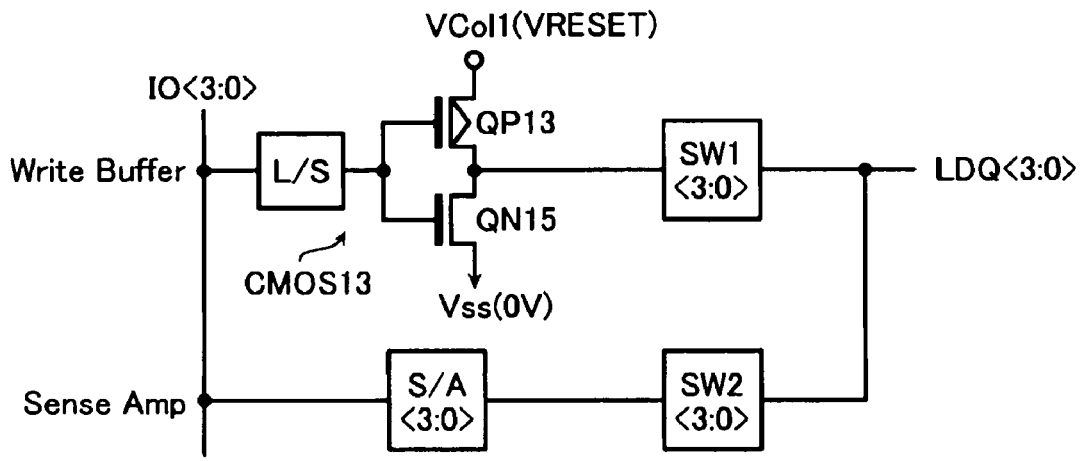
FIG. 11 is a circuit diagram illustrating an example configuration of a column control circuit in the resistive memory device according to the embodiment of the present invention.

As illustrated in FIGS. 4 and 11, a sense amplifier/write buffer 22 is connected to the column power-supply line VCol1, the local data lines LDQ<3:0>, and the data input/output lines IO<3:0>. Firstly, a configuration of the write buffer part will be described below. The data input/output lines IO<3:0> connected to the sense amplifier/write buffer 22 are connected via a level shifter L/S to a CMOS inverter CMOS13 including a PMOS transistor QP13 and an NMOS transistor QN15. The column power-supply line VCol1 is connected to the source of the transistor QP13. A reset voltage VRESET is applied to the column power-supply line VCol1 as discussed below. In addition, the source of the transistor QN15 is connected to the ground. Further, both transistors QP13 and QN15 have their drains connected via a switch SW1 to the local data lines LDQ<3:0>.

Secondly, a configuration of the sense amplifier part will be described below. The data input/output lines IO<3:0> connected to the sense amplifier/write buffer 22 are connected to a sense amplifier S/A. The sense amplifier S/A has a function for comparing a voltage that is generated in the local data lines LDQ due to the current flowing through a selected memory cell with a reference voltage, as will be described below. The reference voltage is generated by a reference voltage generation circuit, not illustrated in FIG. 11. An output terminal of the sense amplifier S/A is connected via a switch SW2 to the local data lines LDQ<3:0>.

[Configuration of Column-Power-Supply-Line Driver 23]

Figure 12:
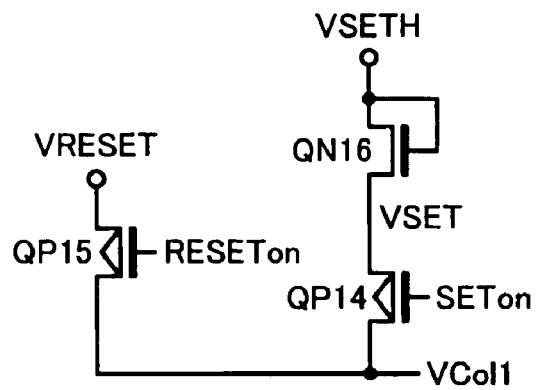
FIG. 12 is a circuit diagram illustrating an example configuration of a column control circuit in the resistive memory device according to the embodiment of the present invention.

As illustrated in FIGS. 4 and 12, a column-power-supply-line driver 23 is connected to a column power-supply line VCol1 and a control signal line. In the column-power-supply-line driver 23, a power supply VSETH is connected to the drain and gate of an NMOS transistor QN16, while the source of the transistor QN16 is connected via a PMOS transistor QP14 to the column power-supply line VCol1. A control signal SETon is supplied to the gate of the transistor QP14.

In addition, in the column-power-supply-line driver 23, a power supply VRESET is connected via a PMOS transistor QP15 to the column power-supply line VCol1. A control signal RESETon is supplied to the gate of the transistor QP15. The control signal RESETon changes from "H" state to "L" state in reset operation.

[Configuration of Sense Amplifier S/A]

Figure 13:
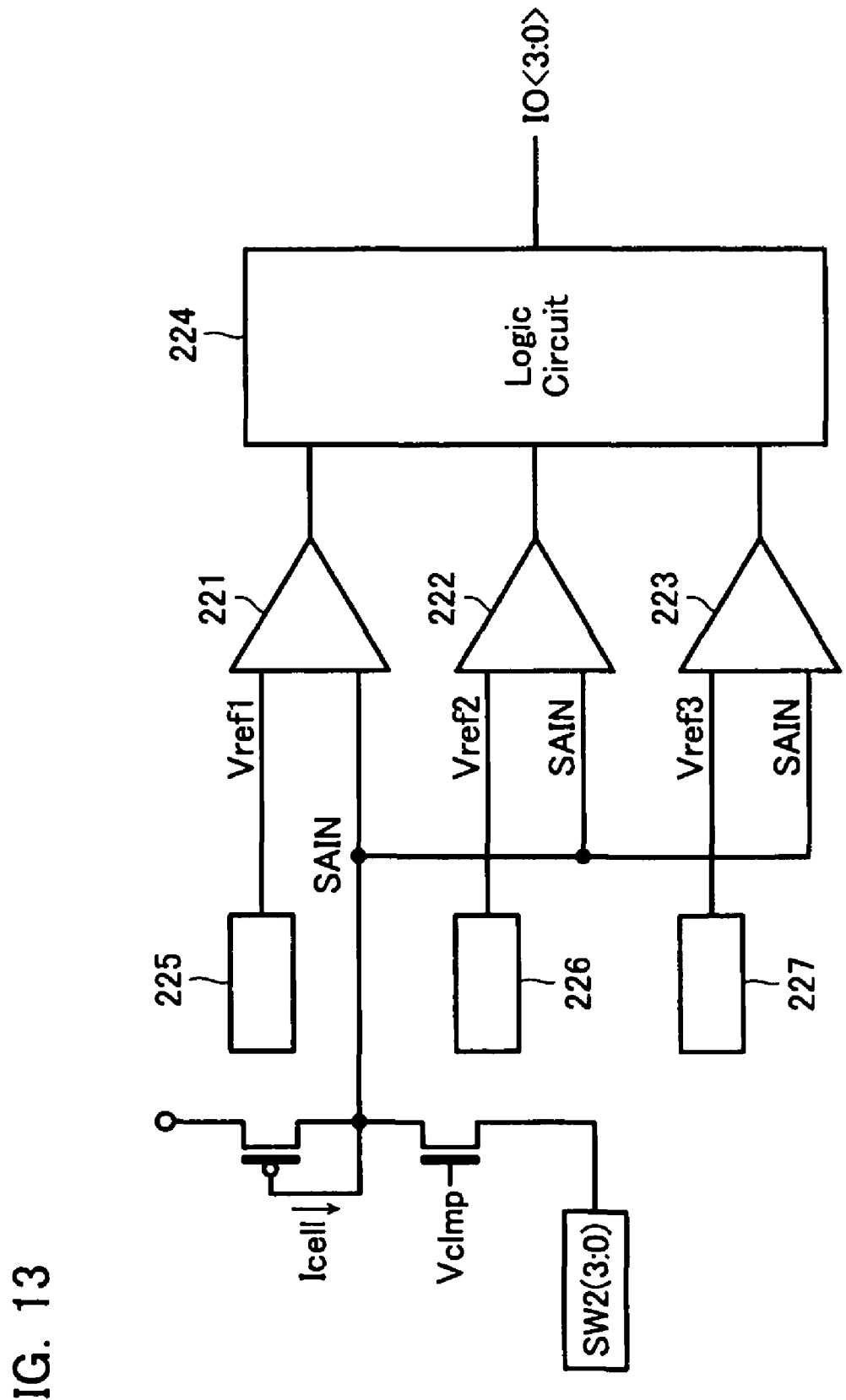
FIG. 13 is a block diagram illustrating a configuration of a sense amplifier S/A.

As illustrated in FIG. 13, a sense amplifier S/A comprises three differential amplifiers 221 to 223, a logic circuit 224, and three reference voltage generation circuits 225 to 227.

The reference voltage generation circuits 225 to 227 are each configured to generate reference voltages Vref1, Vref2, and Vref3 of different magnitudes. As described below, the reference voltage generation circuits 225 to 227 comprises resistive elements, each having substantially the same resistance value as the highest resistance value R11 of the variable resistance elements VR in the memory cells MC, and other resistive elements, each having substantially the same resistance value as the lowest resistance value R10 of the variable resistance elements VR in the memory cells MC. These resistive elements are used in combination with each other to generate the reference voltages Vref1, Vref2, and Vref3.

The differential amplifiers 221 to 223 differentially amplifies the cell voltages Vcell read to the local data lines LDQ<3:0> and the reference voltages Vref1, Vref2, and Vref3 to output the differentially amplified signals.

Based on the output signals from the differential amplifiers 221 to 223, the logic circuit 224 determines data retained in a memory cell MC, the result of which is output to the output lines IO<3:0>.

Figure 14:
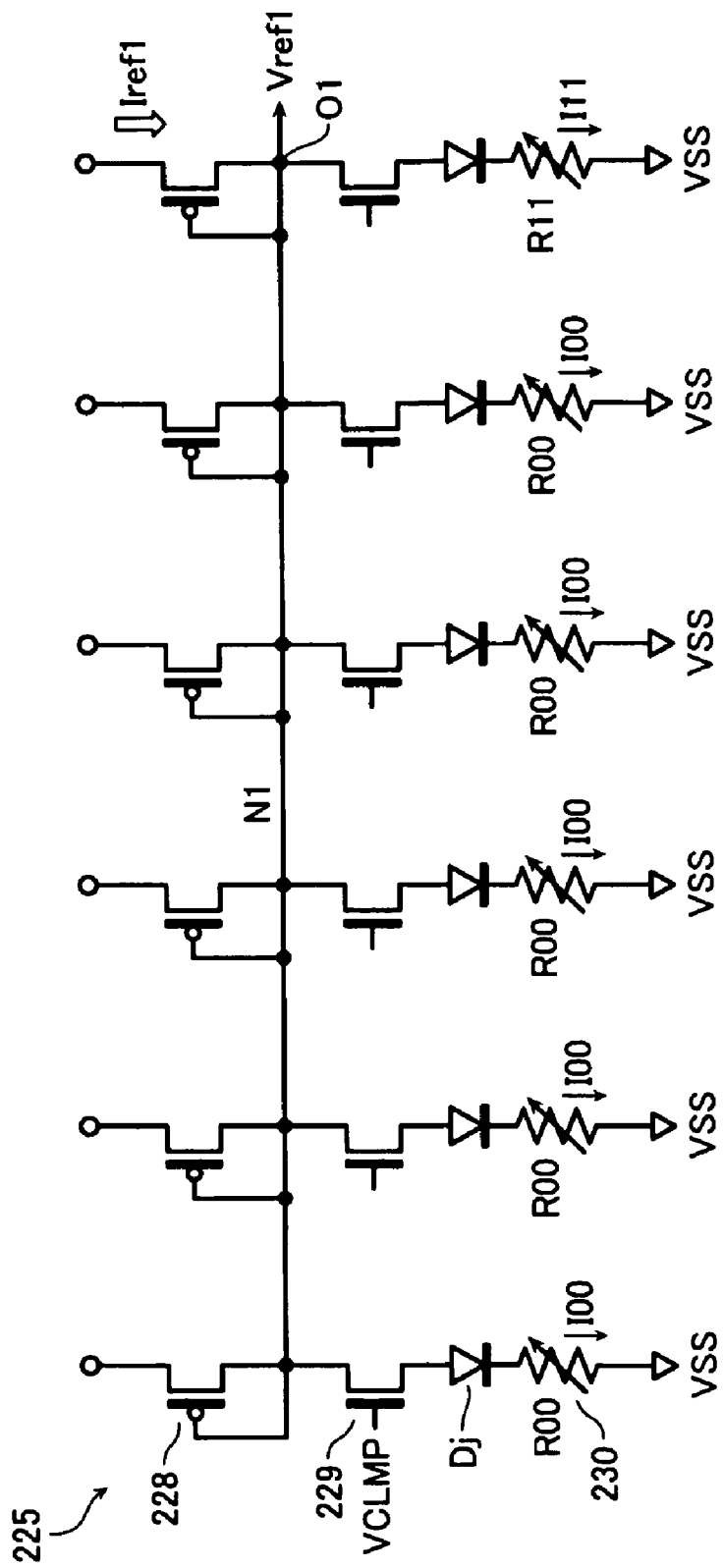
FIG. 14 is a circuit diagram illustrating a configuration of a reference voltage generation circuit 225.

Referring now to FIG. 14, configurations of the reference voltage generation circuits 225 to 227 will be described below.

As can be seen from the above, each of the reference voltage generation circuits 225 to 227 comprises: a plurality of resistive elements 230; a plurality of diodes Dj connected in series to the resistive elements 230; a plurality of clamping transistors 229 connected in series to the diodes Dj; a plurality of p-type MOS transistors 228 connected in series to the plurality of clamping n-type MOS transistors 229 and diode-connected. The plurality of p-type MOS transistors 228 have their drain terminals connected to each other.

Each of the diode-connected p-type MOS transistors 228 has, at a node N1, a source to which a power-supply voltage is supplied, and a drain that is connected to the drain of each of the n-type MOS transistors 229. As such, each of the diode-connected p-type MOS transistors 228 functions as a current regulator circuit that averages currents flowing through each of the plurality of resistive elements 230.

Each of the n-type MOS transistors 229 has its source connected to one end of each of the resistive elements 230. The other end of each of the resistive elements 230 is connected to the ground. Each of the n-type MOS transistors 229 has a gate to which a clamping voltage VCLMP is supplied. As such, each of the n-type MOS transistors 229 functions as a clamping circuit that limits the voltage applied to each of the resistive elements 230. Six sets of these p-type MOS transistors 228, n-type MOS transistors 229, and resistive elements 230 connected in series are formed and the node N1 is connected in common thereto, thereby providing an output terminal O1. That is, the six resistive elements 230 are connected in parallel between the node N1 and the ground terminal via the respective n-type MOS transistors 229, thereby forming a resistance circuit.

Each of the reference voltage generation circuits 225 to 227 has six resistive elements 230 formed therein. Among these, in the reference voltage generation circuit 225, five of the six resistive elements 230 are provided with the minimum resistance value R00 in the memory cells MC (see FIG. 2B), or a resistance value substantially the same as R00. The remaining one is provided with the maximum resistance value R11 in the memory cells (see FIG. 2B). Note that while the resistive elements 230 may be formed by the variable resistance elements in the memory cells MC, they may also be such resistance elements with fixed resistance values.

Provided that Iref1 denotes the magnitude of constant current supplied by six p-type MOS transistors 228, I00 denotes the magnitude of current flowing through the resistive elements 230 provided with a resistance R00, and I11 denotes the magnitude of current flowing through the resistive elements 230, each provided with a resistance R11, then the current flowing through the six resistive elements 230 is averaged, which satisfies the following Formula 1:

$$Iref1 = (5I00 + I11)/6 \qquad \text{[Formula 1]}$$
$$= (I00 + I11)/2 + 2 \times (I00 - I11)/6$$

When ideal current distributions are obtained in the memory cells MC as illustrated in FIG. 2B, the constant current Iref1 generally takes on a value intermediate between the distributions of current I00 and current I10.

Figure 15:
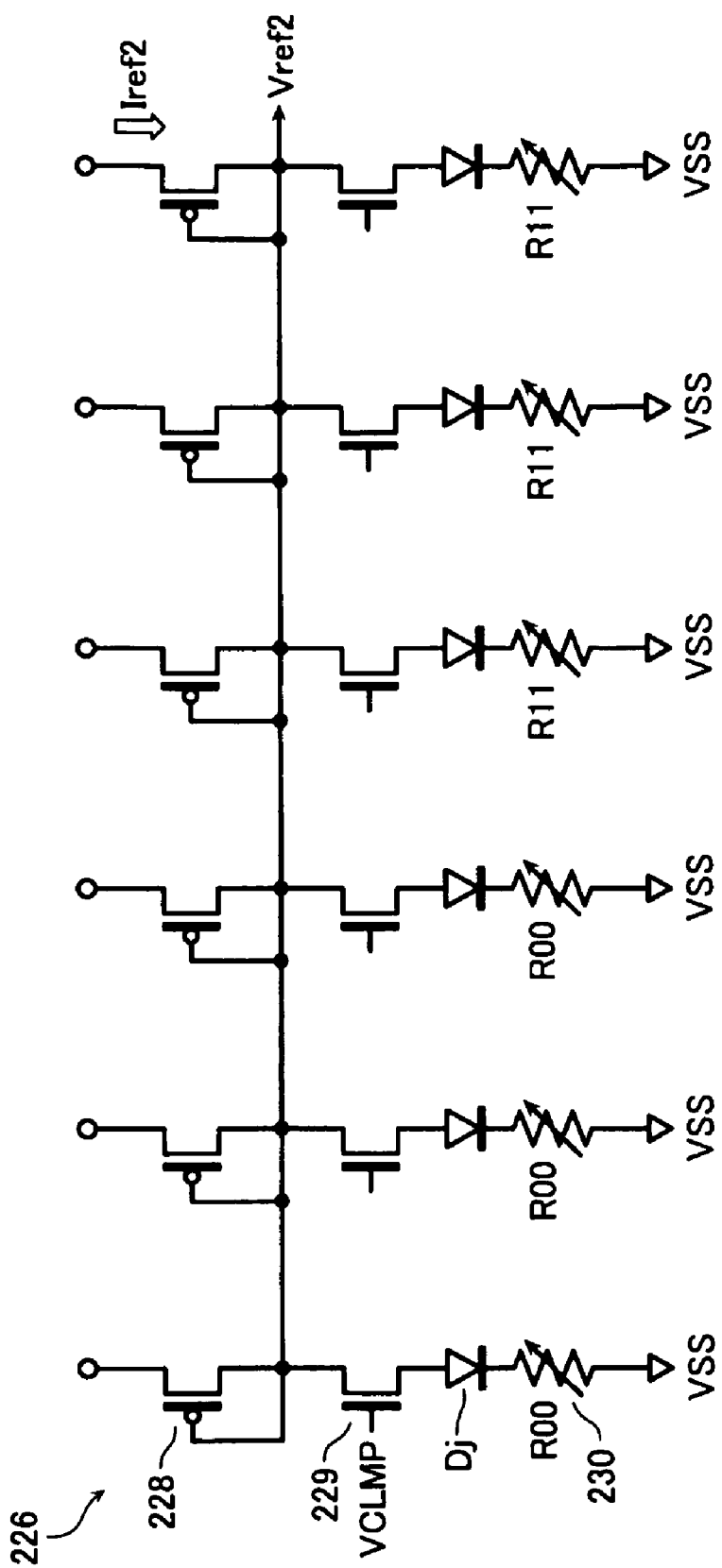
FIG. 15 is a circuit diagram illustrating a configuration of a reference voltage generation circuit 226.

On the other hand, as illustrated in FIG. 15, the reference voltage generation circuit 226 has a similar configuration to the reference voltage generation circuit 225. However, it is different from the reference voltage generation circuit 225 in that three of the six resistive elements 230 are provided with resistance values R00 and the remaining three are provided with resistance values R11. To this extent, the reference current Iref2 generated by the reference voltage generation circuit 226 is represented by the following Formula 2. When ideal current distributions are obtained in the memory cells MC as illustrated in FIG. 2B, the constant current Iref2 generally takes on a value intermediate between the distributions of currents I10 and current I01.

$$Iref2 = (3I00 + 3I11)/6 \qquad \text{[Formula 2]}$$
$$= (I00 + I11)/2$$

Figure 16:
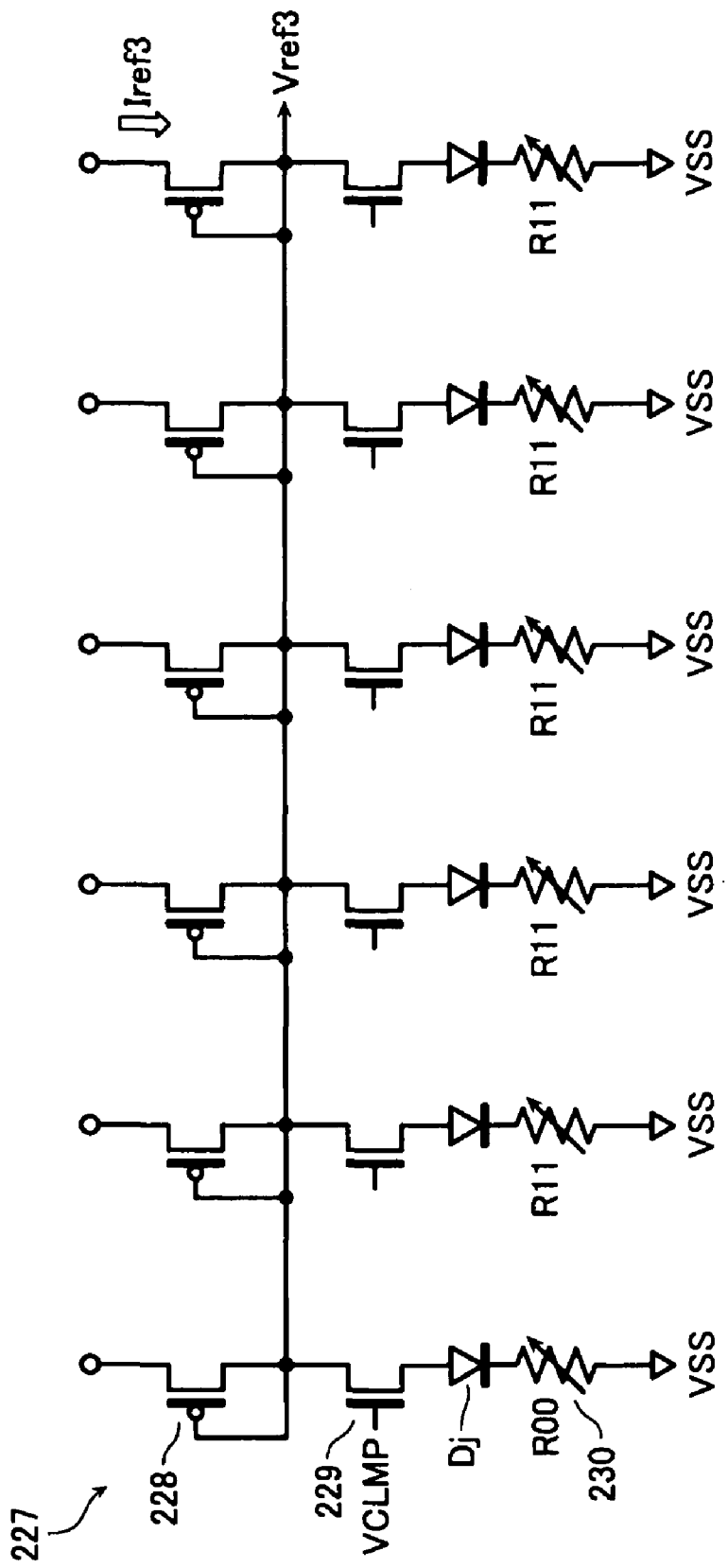
FIG. 16 is a circuit diagram illustrating a configuration of a reference voltage generation circuit 227.

On the other hand, as illustrated in FIG. 16, the reference voltage generation circuit 227 has a similar configuration to the reference voltage generation circuits 225 and 226. However, it is different from the reference voltage generation circuits 225 and 226 in that one of the six resistive elements 230 is provided with a resistance value R00 and the remaining five are provided with resistance values R11. To this extent, the reference current Iref3 generated by the reference voltage generation circuit 227 is expressed as the following Formula 3. When ideal current distributions are obtained in the memory cells MC as illustrated in FIG. 2B, the constant current Iref3 generally takes on a value intermediate between the distributions of current I00 and current I01.

$$Iref3 = (I00 + 5I11)/6 \qquad \text{[Formula 3]}$$
$$= (I00 + I11)/2 - 2 \times (I00 - I11)/6$$

As such, in this embodiment, each of the reference voltage generation circuits 225 to 227 has a plurality of resistive elements 230 provided therein, each having any one of the maximum resistance value R11 and the minimum resistance value R00 among four types of resistance values to be provided to the variable resistance elements VR in the memory cells MC. Since the ratio of the number of resistive elements 230 with the resistance values R11 to that with the resistance values R00 is different for the reference voltage generation circuits 225 to 227 (i.e., 5:1 for 225; 3:3 for 226; 1:5 for 227), different reference currents Iref1 to Iref3 are output, accordingly. Based on the applicants' knowledge that the maximum resistance value R11 and the minimum resistance value R00 can be obtained with a higher degree of precision than the other resistance values, this configuration facilitates the setting of the reference currents Iref1 to Iref3 near the central points of the current distributions. Therefore, this may prevent an erroneous read operation from occurring in the memory cells in which multi-values have been stored. Note that the total number of resistive elements 230 with the resistance values R00 included in the three reference voltage generation circuits 225 to 227 is set equal to that with the resistance values R11. Consequently, the reference currents Iref1 to Iref3 may be provided at equal intervals.

While embodiments of the present invention have been described, the present invention is not intended to be limited to the disclosed embodiments, and various other changes or additions may be made thereto, or any combinations thereof may be possible without departing from the spirit of the invention. For example, while examples have been described in the context of each memory cell MC having four types of resistance values and data of 2 bits being stored for each memory cell in the embodiments described above, it will be appreciated that the present invention is not limited to the disclosed embodiments, but is also applicable to data of 3 bits or more being stored in one memory cell.

Figure 17:
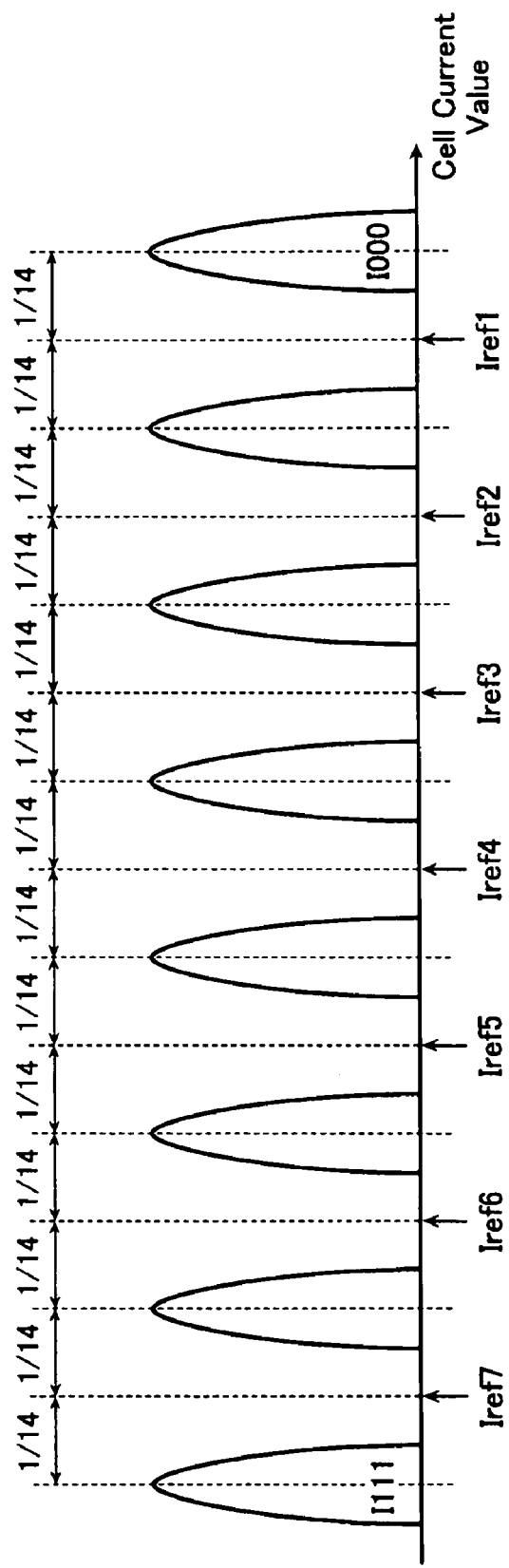
FIG. 17 illustrates a variation of the embodiment of the present invention.
Figure 18:
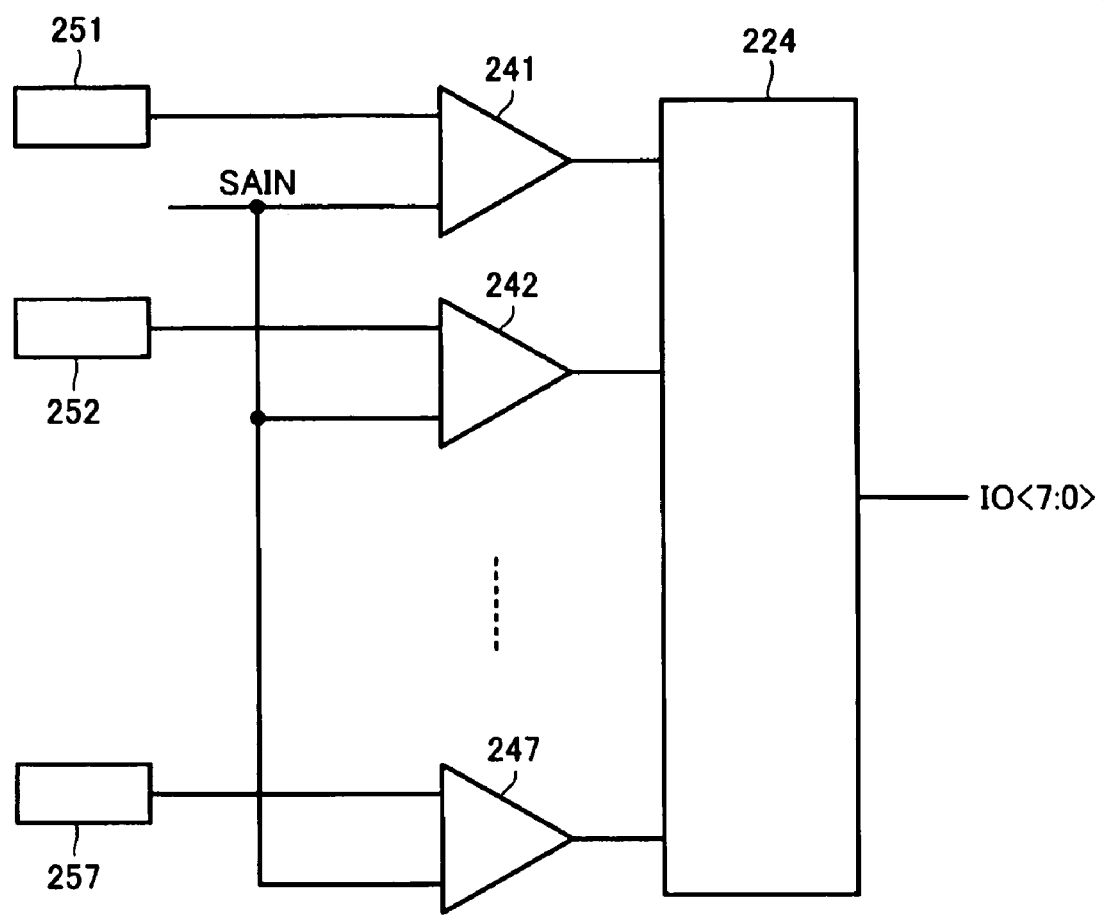
FIG. 18 illustrates a variation of the embodiment of the present invention.

For example, as illustrated in FIG. 17, the present invention is also applicable to a semiconductor storage device that can store 3 bits/cell where eight types of resistance values are set for each memory cell MC, and hence eight types of current distributions can be obtained (the variable resistance elements VR in the memory cells may take on eight types of resistance values, in order of increasing: R000 (min), R001, R010, R011, R100, R101, R110, R111 (max)). In this case, as illustrated in FIG. 18, seven differential amplifiers 241 to 247 and seven reference voltage generation circuits 251 to 257 are prepared to generate seven reference currents Iref1 to Iref7.

Each of the reference voltage generation circuits 251 to 257 has fourteen resistive elements 230 separately provided therein. In the $m^{th}$ (m=1 to 7) reference voltage generation circuits, there are formed (15−2m) resistive elements 230, each having a resistance value substantially the same as the minimum resistance value R000 in the variable resistance elements VR, as well as (2m−1) resistive elements, each having a resistance value substantially the same as the maximum resistance value R111 in the variable resistance elements VR. Consequently, reference currents Irefm (m=1 to 7) generated by the seven reference voltage generation circuits are expressed as follows as the maximum current value I000 and the minimum current value I111:

$$Iref m = \{(15-2m)I000 + (2m-1)I111\}/14 \quad \text{[Formula 4]}$$

In addition, the present invention can be generalized as follows: n-bit data is stored in one memory cell. In this case, $(2^N-1)$ reference voltage generation circuits are prepared to generate $(2^N-1)$ types of reference currents Iref1 to Iref$(2^N-1)$.

An individual reference voltage generation circuit has $2*(2^N-1)$ resistive elements 230 connected in parallel thereto. Then, in the $m^{th}$ (m=1 to $2^N-1$) reference voltage generation circuits, there are formed $(2^{N+1}-2m-1)$ resistive elements 230, each having a resistance value substantially the same as the minimum resistance value Rmin in the variable resistance elements VR, as well as (2m−1) resistive elements, each having a resistance value substantially the same as the maximum resistance value Rmax in the variable resistance elements VR. Consequently, $(2^N-1)$ types of reference currents Irefm (m=1 to $2^N-1$) generated by the $(2^N-1)$ reference voltage generation circuits are expressed as follows as the maximum current value Imax and the minimum current value Imin:

$$Iref m = \{X*Imax + Y*Imin\}/2(2^N-1), \quad \text{[Formula 5]}$$

where $M=2^{N+1}-2m-1$, $N=2m-1$.

What is claimed is:

1. A semiconductor storage device comprising:
   a memory cell array having a plurality of memory cells arranged at intersections of a plurality of first wirings and a plurality of second wirings, each of the memory cells including a variable resistance element capable of taking on four or more types of resistance values;
   a control circuit selectively driving the first wirings and the second wirings;
   a sense amplifier circuit comparing, with a reference voltage, a voltage generated by a current flowing through a selected memory cell arranged at an intersection of the first wiring and the second wiring selectively driven by the control circuit; and
   a reference voltage generation circuit generating the reference voltage,
   the reference voltage generation circuit comprising:
      a resistance circuit including first resistive elements and second resistive elements connected in parallel, each of the first resistive elements having a resistance value substantially the same as a maximum resistance value in the variable resistance elements, and each of the second resistive elements having a resistance value substantially the same as a minimum resistance value in the variable resistance elements; and
      a current regulator circuit averaging currents flowing through the first resistive elements and the second resistive elements.

2. The semiconductor storage device according to claim 1, wherein
   the current regulator circuit includes a plurality of MOS transistors each having a drain terminal connected to one another and diode-connected.

3. The semiconductor storage device according to claim 1, comprising:
   a plurality of the reference voltage generation circuits, wherein
   a ratio of the number of the first resistive elements to the number of the second resistive elements included in one of the reference voltage generation circuits is different from that in another of the reference voltage generation circuits.

4. The semiconductor storage device according to claim 1, further comprising:
   a clamping circuit connected in series to the first resistive elements or the second resistive elements and limiting a voltage applied to each of the first resistive elements or each of the second resistive elements.

5. The semiconductor storage device according to claim 1, wherein
   the memory cells include the variable resistance elements and rectifier elements connected in series.

6. The semiconductor storage device according to claim 3, further comprising:
   a logic circuit determining data retained in the memory cells based on output signals from the plurality of reference voltage generation circuits.

7. The semiconductor storage device according to claim 6, further comprising:
   a clamping circuit connected in series to the first resistive elements or the second resistive elements and limiting a voltage applied to each of the first resistive elements or each of the second resistive elements.

8. The semiconductor storage device according to claim 6, wherein
   the memory cells include the variable resistance elements and rectifier elements connected in series.

9. The semiconductor storage device according to claim 1, wherein
   the current regulator circuit includes a plurality of MOS transistors each having a drain terminal connected to one another and diode-connected,
   the semiconductor storage device comprising a plurality of the reference voltage generation circuits, and
   a ratio of the number of the first resistive elements to the number of the second resistive elements included in one of the reference voltage generation circuits is different from that in another of the reference voltage generation circuits.

10. The semiconductor storage device according to claim 9, further comprising:
a clamping circuit connected in series to the first resistive elements or the second resistive elements and limiting a voltage applied to each of the first resistive elements or each of the second resistive elements.

11. The semiconductor storage device according to claim 9, wherein
the memory cells include the variable resistance elements and rectifier elements connected in series.

12. The semiconductor storage device according to claim 1, comprising:
a plurality of the reference voltage generation circuits, wherein
a ratio of the number of the first resistive elements to the number of the second resistive elements included in one of the reference voltage generation circuits is different from that in another of the reference voltage generation circuits, and
the reference voltage generation circuits further comprises:
a clamping circuit connected in series to the first resistive elements or the second resistive elements and limiting a voltage applied to each of the first resistive elements or each of the second resistive elements.

13. A semiconductor storage device comprising:
a memory cell array having a plurality of memory cells arranged at intersections of a plurality of first wirings and a plurality of second wirings, each of the memory cells including a variable resistance element capable of taking on $2^N$ types of resistance values (where N is a natural number not less than 2);
a control circuit selectively driving the first wirings and the second wirings;
a sense amplifier circuit comparing, with a reference voltage, a voltage generated by a current flowing through a selected memory cell arranged at an intersection of the first wiring and the second wiring selectively driven by the control circuit; and
$(2^N-1)$ reference voltage generation circuits generating the reference voltage,
each of the $(2^N-1)$ reference voltage generation circuits comprising:
a resistance circuit including a total of 2 $(2^N-1)$ first resistive elements and second resistive elements connected in parallel, each of the first resistive elements having a resistance value substantially the same as a maximum resistance value in the variable resistance elements, and each of the second resistive elements having a resistance value substantially the same as a minimum resistance value in the variable resistance elements; and
a current regulator circuit averaging currents flowing through the first resistive elements and the second resistive elements.

14. The semiconductor storage device according to claim 13, wherein
each of the $m^{th}$ (m=1 to $2^N-1$) reference voltage generation circuits includes the (2m−1) first resistive elements and the $(2^{N+1}-2m-1)$ second resistive elements connected in parallel.

15. The semiconductor storage device according to claim 13, wherein
the current regulator circuit includes a plurality of MOS transistors each having a drain terminal connected to one another and diode-connected.

16. The semiconductor storage device according to claim 13, further comprising:
a clamping circuit connected in series to the first resistive elements or the second resistive elements and limiting a voltage applied to each of the first resistive elements or each of the second resistive elements.

17. The semiconductor storage device according to claim 13, wherein
the memory cells include the variable resistance elements and rectifier elements connected in series.

18. The semiconductor storage device according to claim 13, further comprising:
a logic circuit determining data retained in the memory cells based on output signals from the reference voltage generation circuits.

* * * * *